United States Patent
Cheng et al.

(10) Patent No.: US 9,136,327 B1
(45) Date of Patent: Sep. 15, 2015

(54) DEEP TRENCH ISOLATION STRUCTURES AND SYSTEMS AND METHODS INCLUDING THE SAME

(71) Applicants: Xu Cheng, Chandler, AZ (US); Daniel J. Blomberg, Chandler, AZ (US); Jiang-Kai Zuo, Chandler, AZ (US)

(72) Inventors: Xu Cheng, Chandler, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/464,901

(22) Filed: Aug. 21, 2014

(51) Int. Cl.
| H01L 21/336 | (2006.01) |
| H01L 29/06 | (2006.01) |
| H01L 29/36 | (2006.01) |
| H01L 21/762 | (2006.01) |
| H01L 21/8234 | (2006.01) |
| H01L 27/02 | (2006.01) |

(52) U.S. Cl.
CPC ...... *H01L 29/0649* (2013.01); *H01L 21/76224* (2013.01); *H01L 21/823481* (2013.01); *H01L 27/0203* (2013.01); *H01L 29/36* (2013.01)

(58) Field of Classification Search
CPC ................................................ H01L 21/76224
USPC .......................................................... 438/296
See application file for complete search history.

(56) References Cited

U.S. PATENT DOCUMENTS

| 4,470,062 A | 9/1984 | Muramatsu |
| 5,914,523 A | 6/1999 | Bashir et al. |
| 7,608,908 B1 | 10/2009 | Khemka et al. |
| 7,723,800 B2 | 5/2010 | Moens et al. |

*Primary Examiner* — Anthony Ho
(74) *Attorney, Agent, or Firm* — DASCENZO Intellectual Property Law, P.C.

(57) ABSTRACT

Deep trench isolation structures and systems and methods including the same are disclosed herein. The systems include a semiconductor device. The semiconductor device includes a semiconductor body, a device region, and the deep trench isolation structure. The deep trench isolation structure is configured to electrically isolate the device region from other device regions that extend within the semiconductor body. The deep trench isolation structure includes an isolation trench, a dielectric material that extends within the isolation trench, a first semiconducting region, and a second semiconducting region. The methods include methods of manufacturing a semiconductor device that includes the disclosed deep trench isolation structures. The methods also include methods of operating an integrated circuit device that includes a plurality of semiconductor devices that include the disclosed deep trench isolation structures.

6 Claims, 4 Drawing Sheets

DEEP TRENCH ISOLATION STRUCTURES AND SYSTEMS AND METHODS INCLUDING THE SAME

FIELD

This disclosure relates generally to deep trench isolation structures, and more specifically to deep trench isolation structures that provide improved electrical isolation or higher packing density.

BACKGROUND

Integrated circuit devices often include a plurality of semiconductor devices on a single semiconductor substrate or die. It often is desirable to provide electrical isolation between the various semiconductor devices that are present on the semiconductor substrate, and dielectric-lined trenches have been employed to provide this electrical isolation. As the operating voltage or density (i.e., devices per unit area) on semiconductor substrates is increased, it becomes more difficult to maintain a desired level of electrical isolation among the semiconductor devices. In addition, as the density of devices increases, the achieved level of electrical isolation often varies across the semiconductor substrate or across the die. For example, electrical communication (or punch-through currents) between adjacent semiconductor devices often is more difficult to regulate or block. As another example, parasitic field effect transistor (FET) currents between individual semiconductor devices and the semiconductor substrate often are more difficult to regulate or block.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

DETAILED DESCRIPTION

A deep trench isolation structure according to the present disclosure includes an isolation trench that extends from a body surface of a semiconductor body into the semiconductor body and around a device region. The semiconductor body has a first conductivity type and a body dopant concentration. A dielectric material extends within the isolation trench. The deep trench isolation structure also includes a first semiconducting region of the first conductivity type. The first semiconducting region has a first dopant concentration, and the device region separates the first semiconducting region from the body surface. The deep trench isolation structure also includes a second semiconducting region of the first conductivity type. The second semiconducting region has a second dopant concentration and separates the device region from the first semiconducting region. The first dopant concentration is greater than the body dopant concentration and also is greater than the second dopant concentration. The higher dopant concentration in the first semiconducting region increases a turn-on voltage of a parasitic field effect transistor (FET) that can be present within a semiconductor device that includes the deep trench isolation structure, thereby suppressing parasitic FET currents. The higher dopant concentration in the first semiconducting region also increases a voltage differential between adjacent semiconductor devices that is needed to deplete the first semiconducting region, thereby suppressing electrical communication (or punch-through currents) between the adjacent semiconductor devices.

Figure 1:
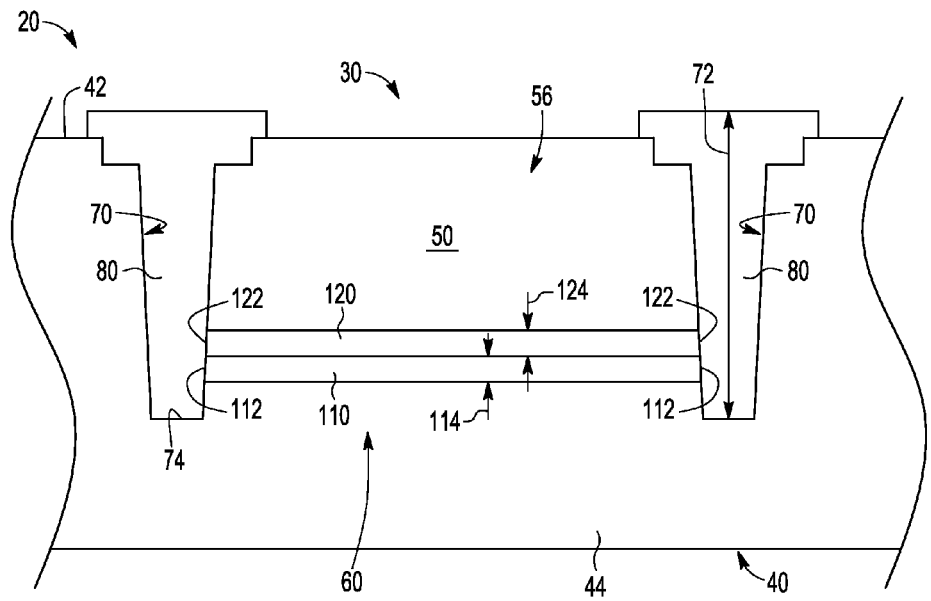
FIG. 1 is a schematic cross-sectional view of an example of a deep trench isolation structure according to the present disclosure.

FIG. 1 is a schematic cross-sectional view of an example of a deep trench isolation structure 60, according to the present disclosure, that forms a portion of a semiconductor device 30. Semiconductor device 30 can form a portion of an integrated circuit device 20 that includes a plurality of semiconductor devices 30.

Semiconductor device 30 includes a portion of a semiconductor body 40 that defines a body surface 42. Semiconductor body 40 has a first conductivity type and a body dopant concentration. Semiconductor device 30 further includes a device region 50. Device region 50 extends within semiconductor body 40, such as from body surface 42 of the semiconductor body.

Deep trench isolation structure 60 is configured to electrically isolate device region 50 from at least a portion of a remainder 44 of semiconductor body 40 (i.e., a portion of semiconductor body 40 that is outside deep trench isolation structure 60) or from one or more other device regions that can be present, or can extend, within semiconductor body 40. Deep trench isolation structure 60 includes an isolation trench 70. Isolation trench 70 extends within semiconductor body 40, such as from body surface 42. Additionally or alternatively, isolation trench 70 extends around device region 50, extends around a periphery of device region 50, partially surrounds device region 50, or defines at least one boundary of device region 50. Deep trench isolation structure 60 also includes a dielectric material 80, which is located, or extends, within isolation trench 70.

Deep trench isolation structure 60 further includes a first semiconducting region 110 and a second semiconducting region 120. First semiconducting region 110 has the first conductivity type and a first dopant concentration. Second semiconducting region 120 has the first conductivity type and a second dopant concentration. The first dopant concentration is different from, or greater than, the body dopant concentration. In addition, the first dopant concentration is different from, or greater than, the second dopant concentration.

First semiconducting region 110 and second semiconducting region 120 can be located to electrically separate device region 50 from remainder 44 of semiconductor body 40. For example, first semiconducting region 110 or second semiconducting region 120 can form at least a portion of a boundary of device region 50 or of a device volume 56 that includes device region 50. As another example, dielectric material 80, body surface 42, and first semiconducting region 110 or second semiconducting region 120 can completely define device volume 56, can completely surround device region 50, or can form boundaries of device region 50. As yet another example, first semiconducting region 110 or second semiconducting region 120 can extend (completely) between device region 50 and remainder 44. As another example, device region 50 can extend between, or separate, first semiconducting region 110 from body surface 42. As yet another example, second semiconducting region 120 can extend between, or separate, first semiconducting region 110 from device region 50.

First semiconducting region 110 and second semiconducting region 120 can be formed in any suitable manner. As examples, first semiconducting region 110 or second semiconducting region 120 can be formed via an implant process, via a diffusion process, or via an epitaxial growth process.

First semiconducting region 110 can have, or define, any suitable thickness 114. As examples, thickness 114 can be at least 0.5 micrometers, at least 0.6 micrometers, at least 0.7 micrometers, at least 0.8 micrometers, at least 0.9 micrometers, at least 1 micrometer, at least 1.1 micrometers, at least 1.2 micrometers, at least 1.3 micrometers, at least 1.4 micrometers, at least 1.5 micrometers, at least 1.6 micrometers, at least 1.7 micrometers, at least 1.8 micrometers, at least 1.9 micrometers, or at least 2 micrometers. Additionally or alternatively, thickness 114 also can be less than 4 micrometers, less than 3.8 micrometers, less than 3.6 micrometers, less than 3.4 micrometers, less than 3.2 micrometers, less than 3 micrometers, less than 2.8 micrometers, less than 2.6 micrometers, less than 2.4 micrometers, less than 2.2 micrometers, or less than 2 micrometers. Thickness 114 also can be between any two of the above-listed thickness values or (at least substantially) equal to any of the above-listed thickness values.

Second semiconducting region 120 can have, or define, any suitable thickness 124. As examples, thickness 124 can be at least 0.1 micrometers, at least 0.2 micrometers, at least 0.3 micrometers, at least 0.4 micrometers, at least 0.5 micrometers, at least 0.6 micrometers, at least 0.7 micrometers, at least 0.8 micrometers, at least 0.9 micrometers, or at least 1 micrometer. Additionally or alternatively, thickness 124 also can be less than 1.5 micrometers, less than 1.4 micrometers, less than 1.3 micrometers, less than 1.2 micrometers, less than 1.1 micrometers, less than 1 micrometer, less than 0.9 micrometers, less than 0.8 micrometers, less than 0.7 micrometers, less than 0.6 micrometers, or less than 0.5 micrometers. Thickness 124 also can be between any two of the above-listed thickness values or (at least substantially) equal to any of the above-listed thickness values.

Isolation trench 70 can include any suitable trench, void space, or depression that can extend into, or be formed within, semiconductor body 40. Isolation trench 70 can be formed in any suitable manner, such as via etching away a portion of semiconductor body 40. As illustrated in FIG. 1, isolation trench 70 can extend through, past, or deeper within (i.e., farther from body surface 42) semiconductor body 40 than second semiconducting region 120. For example, a portion of isolation trench 70 can extend in contact with (or define) an edge region 122 of second semiconducting region 120. As another example, a terminal end 74 of isolation trench 70 can be located a greater distance from body surface 42 than second semiconducting region 120.

Similarly, isolation trench 70 also can extend through, past, or deeper within semiconductor body 40 than first semiconducting region 110. For example, a portion of isolation trench 70 can extend in contact with (or define) an edge region 112 of first semiconducting region 110. As another example, terminal end 74 can be located a greater distance from body surface 42 than first semiconducting region 110.

Isolation trench 70 can have, or define, any suitable depth 72. As examples, depth 72 can be at least 5 micrometers, at least 5.5 micrometers, at least 6 micrometers, at least 6.5 micrometers, at least 7 micrometers, at least 7.5 micrometers, or at least 8 micrometers. Additionally or alternatively, depth 72 also can be less than 12 micrometers, less than 11.5 micrometers, less than 11 micrometers, less than 10.5 micrometers, less than 10 micrometers, less than 9.5 micrometers, less than 9 micrometers, less than 8.5 micrometers, or less than 8 micrometers. Depth 72 also can be (at least substantially) between any two of the above-listed trench depths or (at least substantially) equal to any of the above-listed trench depths.

Dielectric material 80 can include any suitable electrically insulating material that can be located or present within isolation trench 70. As examples, dielectric material 80 can include, or be, a thermally grown oxide, such as a thermally grown silicon oxide, a deposited oxide, such as a deposited silicon oxide, or another electrically insulating material that is not required to include silicon or oxygen.

As discussed, the first dopant concentration of first semiconducting region 110 is greater than the second dopant concentration of second semiconducting region 120. The first dopant concentration can be greater than the second dopant concentration by any suitable amount. For example, the first dopant concentration can be in the range of 5E15 to 5E16 atoms/cc. As another example, the second dopant concentration can be in the range of 1E15 to 5E15 atoms/cc.

As additional examples, a ratio of the first dopant concentration to the second dopant concentration (i.e., the first dopant concentration divided by the second dopant concentration), which also can be referred to herein as a first dopant concentration ratio, can be at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5, at least 10, at least 11, at least 12, at least 13, at least 14, at least 15, at least 16, at least 17, at least 18, at least 19, or at least 20. As additional examples, the first dopant concentration ratio also can be less than 30, less than 28, less than 26, less than 24, less than 22, less than 20, less than 19, less than 18, less than 17, less than 16, less than 15, less than 14, less than 13, less than 12, less than 11, less than 10, less than 9, or less than 8. The first dopant concentration ratio also can be between any two of the above-listed concentration ratios or (at least substantially) equal to any one of the above-listed concentration ratios.

Figure 2:
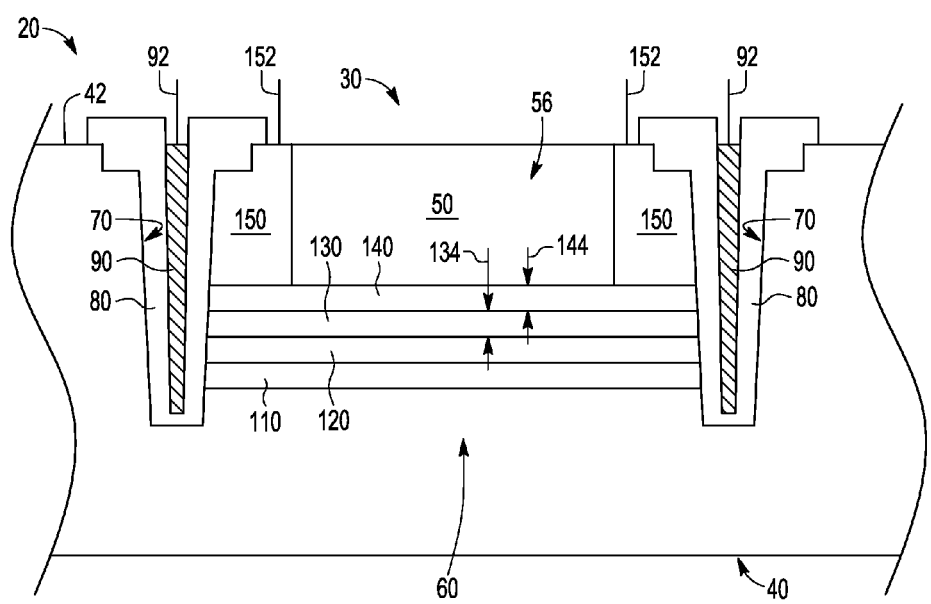
FIG. 2 is a schematic cross-sectional view of another example of a deep trench isolation structure according to the present disclosure.

In practice, the first dopant concentration ratio can be selected based upon (or considering) a variety of different operational factors, or parameters, of semiconducting devices 30 that include deep trench isolation structures 60 according to the present disclosure. For example, increasing the first dopant concentration ratio can decrease a potential for punch-through currents to flow between adjacent semiconductor devices. As another example, increasing the first dopant concentration ratio also can decrease a potential for parasitic FET currents to flow between the adjacent semiconductor devices. However, increasing the first dopant concentration ratio also can decrease the breakdown voltage of the junction formed between second semiconducting region 120 and third semiconducting region 130 (as illustrated in FIG. 2), which provides vertical isolation capability for deep trench isolation structures 60. Thus, a specific first dopant concentration ratio for a given semiconductor device 30 can be selected based upon a desired level of protection against punch-through currents, a desired level of protection against parasitic FET currents, or a desired breakdown voltage for the given semiconductor device 30. The first dopant concentration ratio can vary with the design of the given semiconductor device 30 or one or more desired operational parameters for the given semiconductor device 30.

Semiconductor body 40 can include, or be, any suitable semiconducting material. As examples, semiconductor body 40 can include silicon, silicon germanium, gallium arsenic, gallium arsenide, a Group IV semiconducting material, or a Group III-V semiconducting material. During processing or formation of integrated circuit device 20, semiconductor body 40 can form a portion of, or be, a wafer or a semiconductor wafer. The semiconducting material can be a bulk semiconducting material that forms a portion of a substrate. Alternatively, the semiconducting material can be an epitaxial layer that is grown on the substrate.

The body dopant concentration can have any suitable relative or absolute value. For example, the body dopant concentration can be (at least substantially) similar to the second dopant concentration. As another example, a ratio of the first dopant concentration to the body dopant concentration (i.e., the first dopant concentration divided by the body dopant concentration) can be (at least substantially) similar to the first dopant concentration ratio. As yet another example, the first semiconducting region can be formed or defined via an implant process. The implant process can implant dopant atoms into the semiconducting body and through the second semiconducting region, thereby forming the first semiconducting region.

FIG. 2 is a schematic cross-sectional view of another example of a deep trench isolation structure 60 that forms a portion of a semiconductor device 30. Semiconductor device 30 can form a portion of an integrated circuit device 20 that includes a plurality of semiconductor devices 30. Similar to FIG. 1, semiconductor device 30 of FIG. 2 includes a semiconductor body 40 that has a body surface 42, a device region 50, and deep trench isolation structure 60. Also similar to FIG. 1, deep trench isolation structure 60 of FIG. 2 includes isolation trench 70, dielectric material 80, first semiconducting region 110, and second semiconducting region 120. These structures are (at least substantially) similar to the corresponding structures that are described herein with reference to FIG. 1.

Deep trench isolation structure 60 of FIG. 2 further includes a third semiconducting region 130, a fourth semiconducting region 140, and a fifth semiconducting region 150. Third semiconducting region 130 has a second conductivity type and a third dopant concentration. Fourth semiconducting region 140 has the second conductivity type and a fourth dopant concentration. Fifth semiconducting region 150 has the second conductivity type and a fifth dopant concentration. The fourth dopant concentration is different from, or greater than, the third dopant concentration.

Third semiconducting region 130 and fourth semiconducting region 140 can be located to electrically separate device region 50 from first semiconducting region 110 and second semiconducting region 120. For example, third semiconducting region 130 or fourth semiconducting region 140 can form at least a portion of a boundary of device region 50 or of a device volume 56 that includes device region 50. As another example, dielectric material 80, body surface 42, and third semiconducting region 130 or fourth semiconducting region 140 can completely define device volume 56, can completely surround device region 50, or can form boundaries of device region 50. As yet another example, third semiconducting region 130 and fourth semiconducting region 140 can extend (completely) between device region 50 and first device region 110 or second device region 120. As another example, third semiconducting region 130 can extend between, or separate, second semiconducting region 120 from device region 50. As yet another example, fourth semiconducting region 140 can extend between, or separate, third semiconducting region 130 from device region 50.

Third semiconducting region 130 can have, or define, any suitable thickness 134. As examples, thickness 134 can be at least 0.1 micrometers, at least 0.2 micrometers, at least 0.4 micrometers, at least 0.6 micrometers, at least 0.8 micrometers, at least 1 micrometer, at least 1.2 micrometers, at least 1.4 micrometers, at least 1.6 micrometers, at least 1.8 micrometers, or at least 2 micrometers. Additionally or alternatively, thickness 134 also can be less than 3 micrometers, less than 2.8 micrometers, less than 2.6 micrometers, less than 2.4 micrometers, less than 2.2 micrometers, less than 2 micrometers, less than 1.8 micrometers, less than 1.6 micrometers, less than 1.4 micrometers, less than 1.2 micrometers, or less than 1 micrometer. Thickness 134 also can be between any two of the above-listed thickness values or (at least substantially) equal to any of the above-listed thickness values.

Fourth semiconducting region 140 can have, or define, any suitable thickness 144. As examples, thickness 144 can be at least 1 micrometer, at least 1.2 micrometers, at least 1.4 micrometers, at least 1.6 micrometers, at least 1.8 micrometers, or at least 2 micrometers. Additionally or alternatively, thickness 144 also can be less than 3 micrometers, less than 2.8 micrometers, less than 2.6 micrometers, less than 2.4 micrometers, less than 2.2 micrometers, less than 2 micrometers, less than 1.8 micrometers, or less than 1.6 micrometers. Thickness 144 also can be between any two of the above-listed thickness values or (at least substantially) equal to any of the above-listed thickness values.

Fifth semiconducting region 150 can extend between body surface 42 and fourth semiconducting region 140. Additionally or alternatively, fifth semiconducting region 150 can be located, placed, or configured to provide an electric current or an electric potential to fourth semiconducting region 140, such as via one or more electrical connections 152. FIG. 2 illustrates fifth semiconducting region 150 as extending proximal to, or in contact with, isolation trench 70; however, fifth semiconducting region 150 can be present at any suitable location within semiconductor device 30.

Third semiconducting region 130, fourth semiconducting region 140, and fifth semiconducting region 150 can be formed in any suitable manner. As examples, third semiconducting region 130, fourth semiconducting region 140, or fifth semiconducting region 150 can be formed via an implant process, via a diffusion process, or via an epitaxial growth process.

As discussed, the fourth dopant concentration of fourth semiconducting region 140 is greater than the third dopant concentration of third semiconducting region 130. The fourth dopant concentration can be greater than the third dopant concentration by any suitable amount. For example, the third dopant concentration can be 2E15 to 5E16 atoms/cc. As another example, the fourth dopant concentration can be 1E18 to 1E20 atoms/cc.

As additional examples, a ratio of the fourth dopant concentration to the third dopant concentration (i.e., the fourth dopant concentration divided by the third dopant concentration), which also can be referred to herein a second dopant concentration ratio, can be at least 20, at least 30, at least 40, at least 50, at least 60, at least 70, at least 80, at least 90, at least 100, at least 250, at least 500, at least 1,000, at least 2,500, at least 5,000, at least 7,500, or at least 10,000. As additional examples, the second dopant concentration ratio also can be less than 20,000, less than 17,500, less than 15,000, less than 12,500, less than 10,000, less than 7,500, less than 5,000, less than 2,500, less than 1,000, less than 750, less than 500, less than 250, or less than 100. The second dopant concentration ratio also can be between any two of the above-listed concentration ratios or (at least substantially) equal to any one of the above-listed concentration ratios.

In practice, the second dopant concentration ratio can be selected based upon (or considering) a variety of different operational factors, or parameters, of semiconducting devices 30 that include deep trench isolation structures 60 according to the present disclosure. For example, a breakdown voltage (BV) of a P-N junction that can be present at an interface between second semiconducting region 120 and third semiconducting region 130 can vary based upon the first dopant concentration and the second dopant concentration (or the corresponding first dopant concentration ratio), as based well as upon the third dopant concentration and the fourth dopant concentration (or the corresponding second dopant concentration ratio). As such, selection of specific second dopant concentration ratios for a given semiconducting device 30 can be based upon the first dopant concentration ratio or upon a desired breakdown voltage for the P-N junction.

As also illustrated in FIG. 2, deep trench isolation structure 60 further can include an electrically conductive body 90 that extends within isolation trench 70. Dielectric material 80 can extend at least partially around electrically conductive body 90, can extend between electrically conductive body 90 and semiconductor body 40, can extend between electrically conductive body 90 and device region 50, can electrically isolate electrically conductive body 90 from semiconductor body 40, or can electrically isolate electrically conductive body 90 from device region 50.

Deep trench isolation structure 60 also can include an electrical connection 92 to electrically conductive body 90. Electrical connection 92 can be configured to permit grounding of electrically conductive body 90. Additionally or alternatively, electrical connection 92 can be configured to permit an electrical potential to be conveyed, or applied, to electrically conductive body 90. This grounding or biasing of electrically conductive body 90 can at least partially contain an electric field that can be generated during operation of semiconductor device 30 within device region 50 thereof. Additionally or alternatively, this grounding or biasing of electrically conductive body 90 can at least partially isolate semiconductor device 30 from an electric field that can be generated by an adjacent semiconductor device that can be present on, or within, semiconductor body 40.

During operation of semiconductor devices 30 that include deep trench isolation structures 60, isolation trenches 70, together with dielectric material 80, can provide a high degree of electrical isolation in a horizontal direction (i.e., in a direction that is parallel to body surface 42). This high degree of electrical isolation can resist electric current flow through dielectric material 80 in the horizontal direction despite voltage differentials across dielectric material 80 of greater than 100 Volts (V), greater than 150 V, greater than 200 V, greater than 250 V, or greater than 300 V. In addition, first semiconducting region 110 and second semiconducting region 120 together can define a voltage sustaining layer for a junction that is formed between second semiconducting layer 120 and third semiconducting layer 130. This voltage sustaining layer can effectively suppress electric current flow therethrough in a vertical direction (i.e., in a direction that is perpendicular to body surface 42).

This suppression of electric current flow in the vertical direction can be significantly greater than what would be observed for deep trench isolation structures that do not include first semiconducting region 110 or second semiconducting region 120 due to the higher relative dopant concentration in first semiconducting region 110. This higher relative dopant concentration, which is discussed in more detail herein, causes first semiconducting region 110 to be difficult to deplete despite the presence of (relatively) high voltages within integrated circuit device 20. Hence, semiconductor devices 30 that utilize deep trench isolation structures 60 can effectively suppress punch through and parasitic field effect transistor (FET) current flows between the adjacent semiconductor devices at significantly higher voltages than can be obtained by semiconductor devices that do not include first semiconducting region 110 and second semiconducting region 120.

Electrically conductive body 90 can include, or be formed from, any suitable material. As examples, electrically conductive body 90 can include an electrically conductive material, a metal, or heavily doped polycrystalline silicon. When electrically conductive body 90 includes heavily doped polycrystalline silicon, the electrically conductive body also can be referred to herein as trench poly 90.

The first conductivity type can be p-type (i.e., can utilize holes as the majority charge carrier) or n-type (i.e., can utilize electrons as the majority charge carrier. The second conductivity type is the opposite of the first conductivity type. Thus, when the first conductivity type is p-type, the second conductivity type is n-type. Conversely, when the first conductivity type is n-type, the second conductivity type is p-type.

Figure 3:
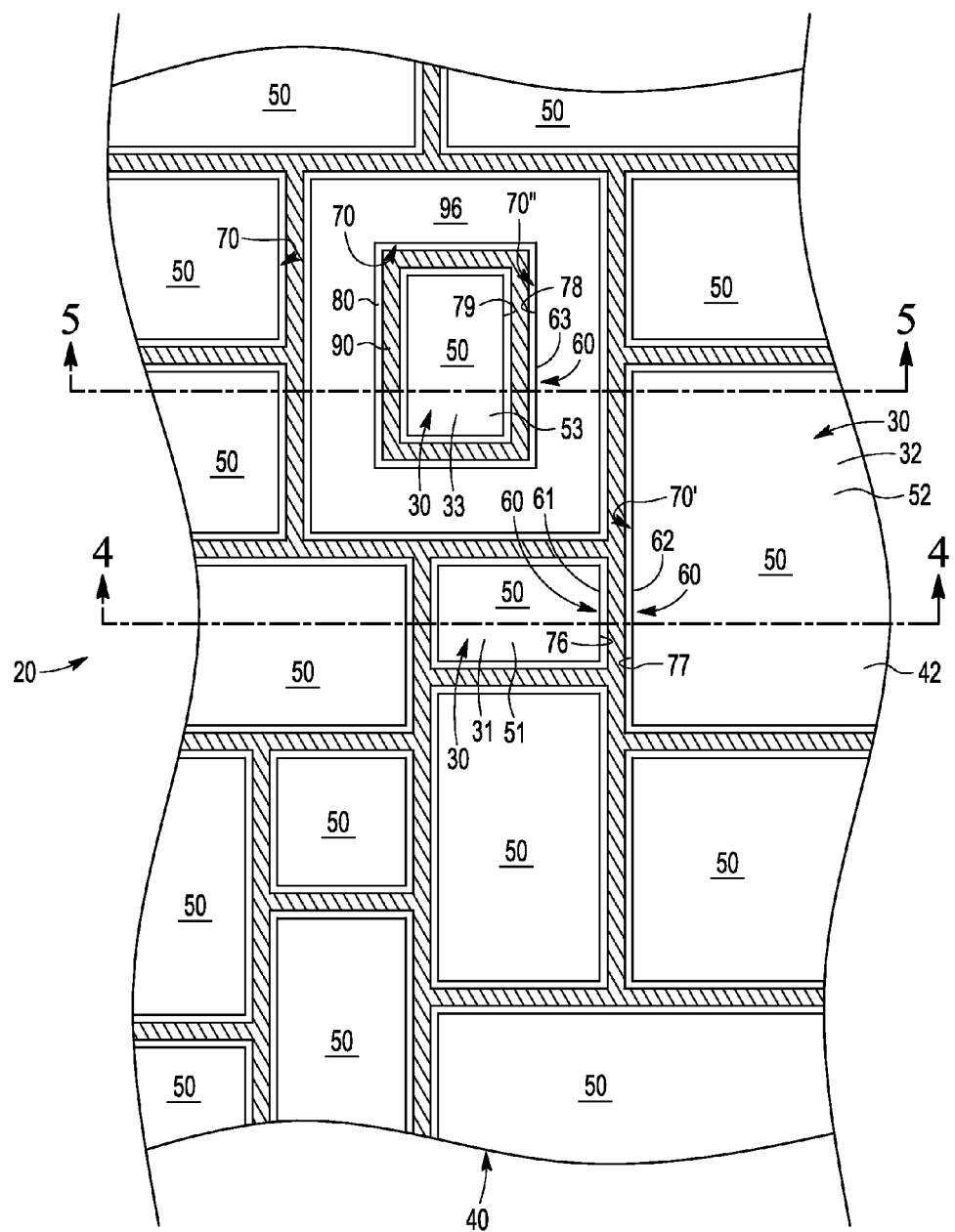
FIG. 3 is a schematic top view of a portion of an integrated circuit device that includes a plurality of deep trench isolation structures according to the present disclosure.
Figure 4:
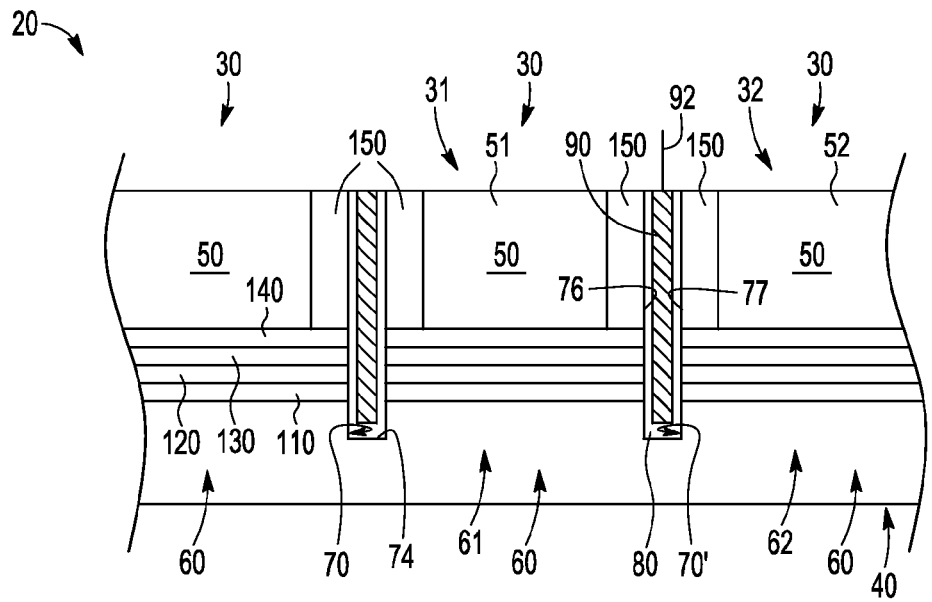
FIG. 4 is a schematic cross-sectional view of the integrated circuit device of FIG. 3 taken along line 4-4 of FIG. 3.
Figure 5:
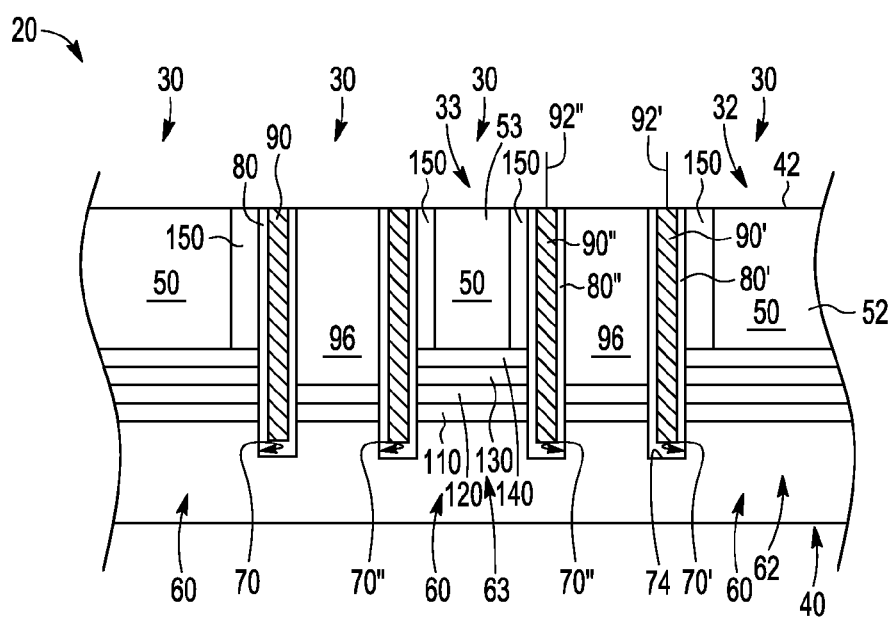
FIG. 5 is a schematic cross-sectional view of the integrated circuit device of FIG. 3 taken along line 5-5 of FIG. 3.

FIG. 3 is a schematic top view of a portion of an integrated circuit device 20 that includes a plurality of deep trench isolation structures 60 according to the present disclosure. FIG. 4 is a schematic cross-sectional view of the integrated circuit device of FIG. 3 taken along line 4-4 of FIG. 3, while FIG. 5 is a schematic cross-sectional view of the integrated circuit device of FIG. 3 taken along line 5-5 of FIG. 3. Deep trench isolation structures 60 can be configured to electrically isolate a plurality of device regions 50 from one another, and the plurality of device regions 50 can include, contain, or have formed therein, a respective plurality of semiconductor devices 30. The structure of individual deep trench isolation structures 60 of FIGS. 3-5 can be (at least substantially) similar to deep trench isolation structure 60 of FIG. 2, which is discussed herein.

FIGS. 3-5 illustrate that deep trench isolation structures 60 according to the present disclosure can be utilized to permit a single isolation trench 70 to extend between adjacent device regions 50 of adjacent semiconductor devices 30. Additionally or alternatively, FIGS. 3-5 also illustrate that, in the systems and methods according to the present disclosure, a single isolation trench 70 can be at least partially shared between adjacent deep trench isolation structures 60 of adjacent semiconductor devices 30. This is in contrast to traditional integrated circuit devices that do not include deep trench isolation structures 60 according to the present disclosure. In such traditional integrated circuit devices, a plurality of isolation trenches must extend between adjacent device regions in order to provide the same level of protection against punch through currents or parasitic FET currents that can be achieved utilizing deep trench isolation structures 60 according to the present disclosure. Thus, deep trench isolation structures 60 according to the present disclosure can permit integrated circuit devices 20 that include a given number of semiconductor devices 30 to be formed in a smaller amount of space than can be achieved utilizing traditional isolation structures, thereby permitting an increase in the density (or packing density) of semiconductor devices 30 on body surface 42 of semiconductor body 40. As examples, integrated circuit devices 20 that include deep trench isolation structures 60 may have a packing density of at least 10%, at least 15%, at least 20%, at least 25%, at least 30%, at least 35%, or at least 40% greater than integrated circuit devices that do not include deep trench isolation structures 60 according to the present disclosure.

As a more specific example, and as illustrated in FIGS. 3-4, integrated circuit device 20 can include a first semiconductor device 31 and an adjacent second semiconductor device 32. First semiconductor device 31 can include a first device region 51 and a first deep trench isolation structure 61. Similarly, second semiconductor device 32 can include a second device region 52 and a second deep trench isolation structure 62. As illustrated, a single isolation trench 70' can form a portion of both first deep trench isolation structure 61 and second deep trench isolation structure 62. Isolation trench 70' can be referred to herein as extending between adjacent device regions 51 and 52. Additionally or alternatively, isolation trench 70' can be referred to herein as extending in contact with first device region 51 (such as via a first wall 76 thereof) and with second device region 52 (such as via a second wall 77 thereof, with the first wall being opposed to the second wall). Isolation trench 70' also can be referred to as defining a boundary of first device region 51 and second device region 52.

As illustrated in FIG. 4, deep trench isolation structures 61 and 62 that isolate device regions 51 and 52 can include first semiconducting region 110, second semiconducting region 120, third semiconducting region 130, fourth semiconducting region 140, or fifth semiconducting region 150. Under these conditions, deep trench isolation structures 61 and 62 that share isolation trench 70' can isolate adjacent device regions 51 and 52 that can be configured for operation at voltage levels that are below a threshold voltage level or that can be configured to operate at similar voltage levels. Examples of the threshold voltage level include threshold voltage levels of less than 40 volts, less than 35 volts, less than 30 volts, or less than 25 volts.

As another more specific example, and as illustrated in FIGS. 3 and 5, integrated circuit device 20 also can include second semiconductor device 32 and an adjacent third semiconductor device 33. Second semiconducting device 32 can include second device region 52 and second deep trench isolation structure 62. Isolation trench 70' can form a portion of second deep trench isolation structure 62. Third semiconductor device 33 can include a third device region 53 and a third deep trench isolation structure 63. An isolation trench 70" can form a portion of third deep trench isolation structure 63.

Isolation trenches 70' and 70" can be spaced apart from one another, such as via an isolation region 96. Isolation region 96 may increase a spacing between second semiconductor device 32 and third semiconductor device 33, thereby permitting higher voltage operation of third semiconductor device 33 or permitting a higher voltage differential to be established between second semiconductor device 32 and third semiconductor device 33 without electrical breakdown therebetween.

As illustrated in FIG. 5, isolation trenches 70' and 70" can contain or include respective dielectric materials 80' and 80" and electrically conductive bodies 90' and 90". Electrically conductive bodies 90' and 90" can be electrically isolated from one another and from semiconductor body 40, such as via dielectric materials 80' and 80", respectively. Electrical connections 92' and 92" can permit independent electrical biasing of electrically conductive bodies 90' and 90". This independent electrical biasing may provide additional shielding between second semiconductor device 32 and third semiconductor device 33, thereby permitting higher voltage operation of third semiconductor device 33 or permitting a higher voltage differential to be established between second semiconductor device 32 and third semiconductor device 33 without electrical breakdown therebetween.

Second semiconductor devices 32 and third semiconductor devices 33 that have isolation trenches 70' and 70" and isolation region 96 extending therebetween can be configured for operation at voltage levels that are greater than the threshold voltage level. As examples, such semiconductor devices can be configured to operate at voltages of greater than 40 volts, greater than 45 volts, greater than 50 volts, greater than 55 volts, greater than 60 volts, greater than 65 volts, greater than 70 volts, greater than 75 volts, greater than 80 volts, greater than 85 volts, greater than 90 volts, greater than 95 volts, greater than 100 volts, greater than 105 volts, or greater than 110 volts.

As illustrated in FIG. 5, second deep trench isolation structure 62 and third deep trench isolation structure 63 can include first semiconducting region 110, second semiconducting region 120, third semiconducting region 130, fourth semiconducting region 140, and fifth semiconducting region 150. Isolation region 96 includes first semiconducting region 110 and second semiconducting region 120 but does not include third semiconducting region 130, fourth semiconducting region 140, or fifth semiconducting region 150.

Figure 6:
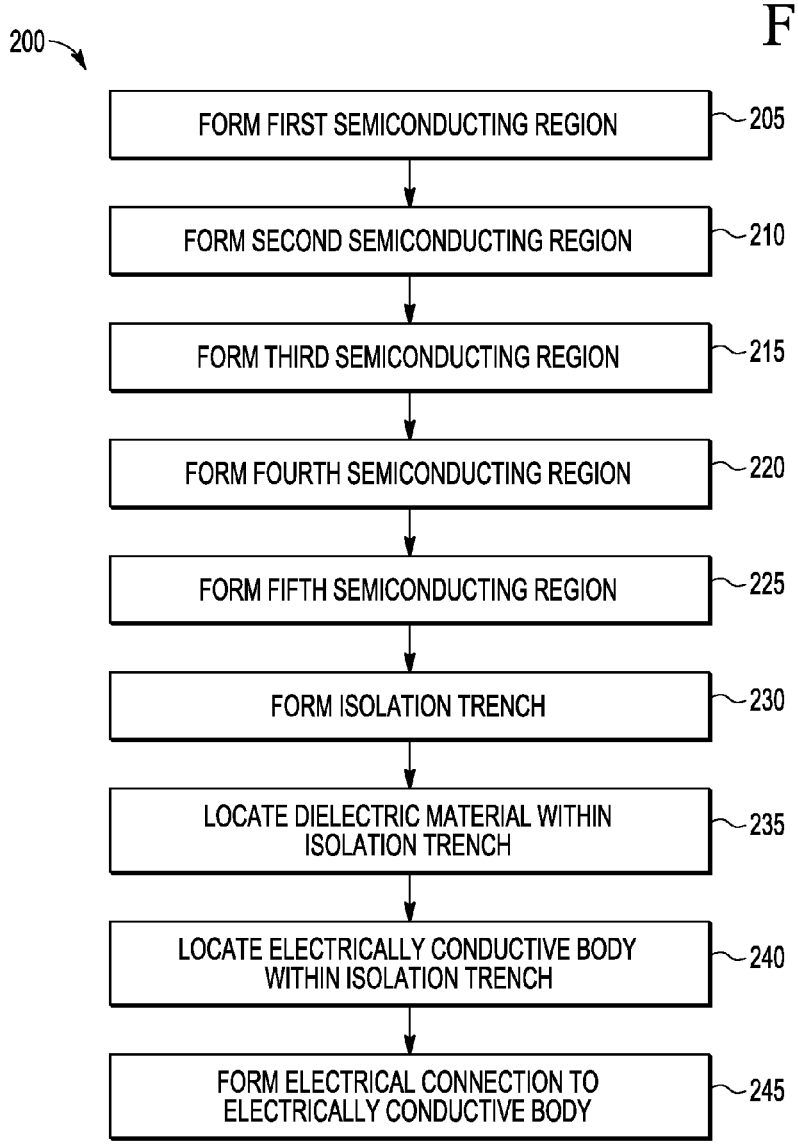
FIG. 6 is a flowchart depicting methods, according to the present disclosure, of manufacturing a semiconductor device.

FIG. 6 is a flowchart depicting methods 200, according to the present disclosure, of manufacturing a semiconductor device. Methods 200 can include forming a first semiconducting region at 205, forming a second semiconducting region at 210, forming a third semiconducting region at 215, forming a fourth semiconducting region at 220, or forming a fifth semiconducting region at 225. Methods 200 also can include forming an isolation trench at 230, locating a dielectric material within the isolation trench at 235, locating an electrically conductive body within the isolation trench at 240, or forming an electrical connection to the electrically conductive body at 245.

Forming the first semiconducting region at 205 can include forming the first semiconducting region of a first conductivity type within a semiconductor body of the first conductivity type. The first semiconducting region has a first dopant concentration. The semiconductor body has a body dopant concentration and a body surface. A device region of the semiconductor device separates the first semiconducting region from the body surface.

Forming the second semiconducting region at 210 can include forming the second semiconducting region of the first conductivity type within the semiconductor body. The second semiconducting region has a second dopant concentration and separates the device region from the first semiconducting region. The first dopant concentration is greater than the body dopant concentration. The first dopant concentration also is greater than the second dopant concentration. Examples of the first dopant concentration and the second dopant concentration, as well as ratios thereof, are disclosed herein.

Forming the third semiconducting region at 215 can include forming the third semiconducting region of a second conductivity type within the semiconductor body. The third semiconducting region has a third dopant concentration and separates the second semiconducting region from the device region.

Forming the fourth semiconducting region at 220 can include forming the fourth semiconducting region of the second conductivity type within the semiconductor body. The fourth semiconducting region has a fourth dopant concentration and separates the third semiconducting region from the device region. The fourth dopant concentration is greater than the third dopant concentration. Examples of the third dopant concentration and the fourth dopant concentration, as well as ratios thereof, are disclosed herein.

Forming the fifth semiconducting region at 225 can include forming the fifth semiconducting region of the second conductivity type within the semiconductor body. The fifth semiconducting region has a fifth dopant concentration and extends between the body surface and the fourth semiconducting region.

The first semiconducting region, the second semiconducting region, the third semiconducting region, the fourth semiconducting region and the fifth semiconducting region collectively can be referred to herein as various semiconducting regions. The various semiconducting regions can be formed in any suitable manner. As examples, one or more of the various semiconducting regions can be formed via one or more of an implant process, a thermal diffusion process, an epitaxial growth process, or a deposition process. This can include the use of lithographic or other patterning technologies to define region(s) of the semiconductor body that include, or define, one or more of the various semiconducting regions.

In addition, the various semiconducting regions can be formed in any suitable order and any number of additional process steps can be utilized before, during, or after formation of the various semiconducting regions. For example, methods 200 initially can include performing an implant process to accomplish the forming at 215 and the forming at 220. Subsequently, a thermal diffusion process can be utilized to repair damage caused by the implant process or to define a desired concentration profile for the third and fourth semiconducting regions within the semiconductor body. Then, a high energy implant process can be utilized to accomplish the forming at 205 and the forming at 210. This can include implanting the first semiconductor layer below the second, third, and fourth semiconducting layers or defining the second semiconducting layer responsive to, as a result of, or concurrently with formation of the first semiconducting layer. Subsequently, an epitaxial growth process can be utilized to form an epitaxial layer above the fourth semiconducting region, to increase a distance between the body surface and the fourth semiconducting region, or to define a region of the semiconductor body that is to include the device region. After formation of the epitaxial layer, another implant process can be utilized to accomplish the forming at 225.

Forming the isolation trench at 230 can include forming the isolation trench such that the isolation trench extends into the semiconductor body from the body surface. Additionally or alternatively, the forming at 230 also can include forming the isolation trench such that the isolation trench extends around the device region, partially surrounds the device region, or forms a boundary of the device region. The forming at 230 further can include forming the isolation trench such that the isolation trench extends through the first semiconducting region, extends farther from the body surface than the first semiconducting region, extends through the second semiconducting region, extends farther from the body surface than the second semiconducting region, extends through the third semiconducting region, extends farther from the body surface than the third semiconducting region, extends through the fourth semiconducting region, or extends farther from the body surface than the fourth semiconducting region.

The forming at 230 can include forming, or defining, the isolation trench in any suitable manner. For example, the forming at 230 can include etching the isolation trench into the semiconductor body. As another example, the forming at 230 can include lithographically patterning the semiconductor body to define a location of the isolation trench. The isolation trench can have, or define, any suitable depth, illustrative, non-exclusive examples of which are disclosed herein.

Locating the dielectric material within the isolation trench at 235 can include locating any suitable dielectric material within the isolation trench in any suitable manner. As examples, the locating at 235 can include growing the dielectric material within the isolation trench or depositing the dielectric material within the isolation trench. Examples of the dielectric material are disclosed herein.

Locating the electrically conductive body within the isolation trench at 240 can include locating any suitable electrically conductive body within the isolation trench. This can include locating the electrically conductive body such that the dielectric material extends between the electrically conductive body and the semiconductor body. This also can include locating the electrically conductive body such that the dielectric material electrically isolates the electrically conductive body from the semiconductor body. The locating at 240 can be performed in any suitable manner. For example, the locating at 240 can include depositing the electrically conductive body within the isolation trench or within a recess that is defined within the isolation trench by the dielectric material.

Forming the electrical connection to the electrically conductive body at 245 can include forming any suitable electrical connection with the electrically conductive body in any suitable manner. For example, the forming at 245 can include electrically contacting the electrically conductive body with a conductor, such as a metal layer of the semiconductor device. The electrical connection can be configured to permit grounding of the electrically conductive body, can be configured to ground the electrically conductive body, can be configured to permit an electrical potential to be conveyed to the electrically conductive body, or can be configured to convey the electrical potential to the electrically conductive body.

Methods 200 can be applied to manufacture of an integrated circuit device that includes a plurality of semiconductor devices. For example, the semiconductor device can be a first semiconductor device, and the integrated circuit device also can include a second semiconductor device. The device region can be a first device region of the first semiconductor device, and the integrated circuit device further can include a second device region of the second semiconductor device. The first semiconductor device can be adjacent the second semiconductor device.

Under these conditions, the forming the first semiconducting region at 205 can include forming the first semiconducting region such that both the first device region and the second device region separate the first semiconducting region from the body surface. In addition, the forming the second semiconducting region at 210 can include forming the second semiconducting region such that the second semiconducting region separates the first semiconducting region from both the first device region and the second device region. Furthermore, the forming the third semiconducting region at 215 can include forming the third semiconducting region such that the third semiconducting region separates the second semiconducting region from both the first device region and the second device region. In addition, the forming the fourth semiconducting region at 220 can include forming the fourth semiconducting region such that the fourth semiconducting region separates the third semiconducting region from both the first device region and the second device region.

Under these conditions, the forming the isolation trench at 230 can include forming the isolation trench such that the isolation trench extends between the first device region and the second device region. The forming at 230 also can include forming such that the isolation trench extends in contact with the first device region and with the second device region. The forming at 230 further can include forming such that the isolation trench (or opposed walls thereof) defines a boundary of both the first device region and the second device region.

Figure 7:
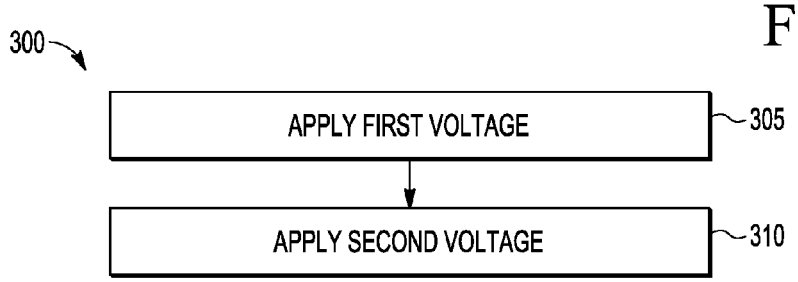
FIG. 7 is a flowchart depicting methods of operating an integrated circuit device according to the present disclosure.

FIG. 7 is a flowchart depicting methods 300 of operating an integrated circuit device according to the present disclosure. Methods 300 can include applying a first voltage at 305 or applying a second voltage at 310.

Applying the first voltage at 305 can include applying any suitable first voltage to a first electrically conductive body. The first electrically conductive body can form a portion of a first deep trench isolation structure of a first semiconductor device of the integrated circuit device. The first semiconductor device can include semiconductor device 30, which is disclosed herein.

Applying the second voltage at 310 can include applying the second voltage to a second electrically conductive body. The second electrically conductive body can form a portion of a second deep trench isolation structure of a second semiconductor device of the integrated circuit device. The second semiconductor device can be adjacent to the first semiconductor device and can include another semiconductor device 30.

The first semiconductor device can include a first device region of the integrated circuit device and the second semiconductor device can include a second device region of the integrated circuit device. The first device region and the second device region can extend into a semiconductor body of a first conductivity type from a body surface of the semiconductor body. The semiconductor body can have a body dopant concentration. The first device region and the second device region can separate a first semiconducting region from the body surface. The first semiconducting region can have a first conductivity type and a first dopant concentration. A second semiconducting region can separate the first semiconducting region from the first device region and from the second device region. The second semiconducting region can have the first conductivity type and a second dopant concentration.

The first deep trench isolation structure can include a first isolation trench that can extend into the semiconductor body from the body surface. The first isolation trench can extend between the first device region and the second device region. A first dielectric material can extend within the first isolation trench. The first electrically conductive body can extend within the first isolation trench. The first dielectric material can electrically isolate the first electrically conductive body from the semiconductor body or from the second electrically conductive body.

The second deep trench isolation structure can include a second isolation trench that can extend into the semiconductor body from the body surface. The second isolation trench can extend between the first device region and the second device region. A second dielectric material can extend within the second isolation trench. The second electrically conductive body can extend within the second isolation trench. The second dielectric material can electrically isolate the second electrically conductive body from the semiconductor body or from the first electrically conductive body.

The second voltage can be different from the first voltage. The first deep trench isolation structure can be (at least partially) spaced apart from the second deep trench isolation structure. The first isolation trench can be (at least partially or completely) spaced apart from the second isolation trench. The first electrically conductive body can be (completely) spaced apart from the second electrically conductive body.

The applying at 305 and the applying at 310 can include applying such that a magnitude of a difference between the first voltage and the second voltage is at least a threshold voltage difference. Examples of the threshold voltage difference include threshold voltage differences of at least 20 volts, at least 25 volts, at least 30 volts, at least 35 volts, at least 40 volts, at least 45 volts, at least 50 volts, at least 55 volts, at least 60 volts, at least 65 volts, at least 70 volts, at least 75 volts, at least 80 volts, at least 85 volts, at least 90 volts, at least 95 volts, or at least 100 volts. Additionally or alternatively, the threshold voltage difference also can be less than 110 volts, less than 105 volts, less than 100 volts, less than 95 volts, less than 90 volts, less than 85 volts, less than 80 volts, less than 75 volts, less than 70 volts, less than 65 volts, less than 60 volts, less than 55 volts, less than 50 volts, or less than 45 volts. The threshold voltage difference also can be between any two of the above-listed threshold voltage differences or (at least substantially) equal to any one of the above-listed threshold voltage differences.

The applying at 305 or the applying at 310 can include applying zero volts to the first electrically conductive body or to the second electrically conductive body, grounding the first electrically conductive body or the second electrically conductive body, applying zero volts to one of the first electrically conductive body and the second electrically conductive body while applying at least a threshold applied voltage to the other of the first electrically conductive body and the second electrically conductive body, or grounding one of the first electrically conductive body and the second electrically conductive body while applying at least the threshold applied voltage to the other of the first electrically conductive body and the second electrically conductive body. Examples of the threshold applied voltage include any of the threshold voltage differences that are disclosed herein. The threshold applied voltage can be applied by electrically shorting the first electrically conductive body to the first device or by electrically shorting the second electrically conductive body to the second device Although the invention is described herein with reference to specific embodiments, various modifications and changes can be made without departing from the scope of the present invention as set forth in the claims below. For example, device region 50 can include additional structures that are not illustrated or discussed in detail herein. These additional structures can contribute additional functionality to semiconductor devices 30 that include deep trench isolation structures 60 or can augment deep trench isolation structures 60. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

As used herein, the phrase, "for example," the phrase, "as an example," or simply the term "example," when used with reference to one or more components, features, details, structures, embodiments, or methods according to the present disclosure, are intended to convey that the described component, feature, detail, structure, embodiment, or method is an illustrative, non-exclusive example of components, features, details, structures, embodiments, or methods according to the present disclosure. Thus, the described component, feature, detail, structure, embodiment, or method is not intended to be limiting, required, or exclusive/exhaustive; and other components, features, details, structures, embodiments, or methods, including structurally or functionally similar or equivalent components, features, details, structures, embodiments, or methods, are also within the scope of embodiments of the present invention.

The following are various embodiments of the present invention.

In a first embodiment, there is provided a semiconductor device. The semiconductor device includes a semiconductor body of a first conductivity type. The semiconductor body has a body dopant concentration and a body surface. The semiconductor device has a device region. The device region extends into the semiconductor body from the body surface. The semiconductor device has a deep trench isolation structure. The deep trench isolation structure is configured to electrically isolate the device region from other device regions that extend within the semiconductor body. The deep trench isolation structure has an isolation trench that extends into the semiconductor body from the body surface and extends around the device region. The deep trench isolation structure has a dielectric material that extends within the isolation trench. The deep trench isolation structure has a first semiconducting region of the first conductivity type. The first semiconducting region has a first dopant concentration. The device region separates the first semiconducting region from the body surface. The deep trench isolation structure has a second semiconducting region of the first conductivity type. The second semiconducting region has a second dopant concentration. The second semiconducting region separates the device region from the first semiconducting region. The first dopant concentration is greater than the body dopant concentration. The first dopant concentration is greater than the second dopant concentration. The deep trench isolation structure can have a third semiconducting region of a second conductivity type that is opposite the first conductivity type. The third semiconducting region can have a third dopant concentration and can separate the second semiconducting region from the device region. The deep trench isolation structure can have a fourth semiconducting region of the second conductivity type. The fourth semiconducting region can have a fourth dopant concentration and can separate the third semiconducting region from the device region. The deep trench isolation structure can have a fifth semiconducting region of the second conductivity type. The fifth semiconducting region can have a fifth dopant concentration and can extend between the body surface and the fourth semiconducting region. The fourth dopant concentration can be greater than the third dopant concentration. A ratio of the fourth dopant concentration to the third dopant concentration can be between 50 and 10,000. The isolation trench can extend through the second semiconducting region. The isolation trench can extend through the first semiconducting region. A ratio of the first dopant concentration to the second dopant concentration can be between 2 and 20. Additional examples of ratios of the first dopant concentration to the second dopant concentration are disclosed herein. The deep trench isolation structure can have an electrically conductive body that extends within the isolation trench. The dielectric material can extend between the electrically conductive body and the semiconductor body. The dielectric material can electrically isolate the electrically conductive body from the semiconductor body. The deep trench isolation structure can have an electrical connection to the electrically conductive body. The electrical connection can be configured to permit grounding of the electrically conductive body. The electrical connection can be configured to permit an electrical potential to be conveyed to the electrically conductive body. The device region can be a first device region. The deep trench isolation structure can be a first deep trench isolation structure. The semiconductor device can have a second device region. The semiconductor device can have a second deep trench isolation structure that is configured to electrically isolate the second device region from the first device region. The isolation trench can extend in contact with the first device region and the second device region. The isolation trench can form a portion of both the first deep trench isolation structure and the second deep trench isolation structure.

In a second embodiment, there is provided a method of forming a semiconductor device. The method includes forming a first semiconducting region of a first conductivity type within a semiconductor body of the first conductivity type. The first semiconducting region has a first dopant concentration. The semiconductor body has a body dopant concentration and a body surface. The semiconductor device has a device region that separates the first semiconducting region from the body surface. The method includes forming a second semiconducting region of the first conductivity type within the semiconductor body. The second semiconducting region has a second dopant concentration. The second semiconducting region separates the device region from the first semiconducting region. The method includes forming an isolation trench that extends into the semiconductor body from the body surface and that further extends around the device region. The method includes locating a dielectric material within the isolation trench. The first dopant concentration is greater than the body dopant concentration. The first dopant concentration is greater than the second dopant concentration. The method can include forming a third semiconducting region of a second conductivity type that is opposite the first conductivity type within the semiconductor body. The third semiconducting region can have a third dopant concentration and the third semiconducting region can separate the second semiconducting region from the device region. The method can include forming a fourth semiconducting region of the second conductivity type within the semiconductor body. The fourth semiconducting region can have a fourth dopant concentration and the fourth semiconducting region can separate the third semiconducting region from the device region. The method can include forming a fifth semiconducting region of the second conductivity type within the semiconductor body. The fifth semiconducting region can have a fifth dopant concentration and the fifth semiconducting region can extend between the body surface and the fourth semiconducting region. The fourth dopant concentration can be greater than the third dopant concentration. The forming the isolation trench can include forming the isolation trench such that the isolation trench extends through the first semiconducting region and through the second semiconducting region. The method can include locating an electrically conductive body within the isolation trench. The dielectric material can extend between the electrically conductive body and the semiconductor body. The dielectric material can electrically isolate the electrically conductive body from the semiconductor body. The method can include forming an electrical connection to the electrically conductive body. The electrical connection can permit grounding of the electrically conductive body. The electrical connection can permit an electrical potential to be conveyed to the electrically conductive body. The semiconductor device can be a first semiconductor device of an integrated circuit device. The device region can be a first device region of the first semiconductor device. The integrated circuit device can include a second device region of a second semiconductor device that is adjacent to the first device region. The forming the first semiconducting region can include forming the first semiconducting region such that both the first device region and the second device region separate the first semiconducting region from the body surface. The forming the second semiconducting region can include forming the second semiconducting region such that the second semiconducting region separates the first semiconducting region from both the first device region and the second device region. The forming the isolation trench can include forming such that the isolation trench extends between and in contact with the first device region and the second device region.

In a third embodiment, there is provided a method of operating an integrated circuit device. The method includes applying a first voltage to a first electrically conductive body of a first deep trench isolation structure of a first semiconductor device. The method includes applying a second voltage to a second electrically conductive body of a second deep trench isolation structure of a second semiconductor device that is adjacent to the first semiconductor device. The first semiconductor device includes a first device region of the integrated circuit device. The second semiconductor device includes a second device region of the integrated circuit device. The first device region and the second device region extend into a semiconductor body from a body surface of the semiconductor body. The semiconductor body is of a first conductivity type and has a body dopant concentration. The first device region and the second device region separate a first semiconducting region, which has the first conductivity type and a first dopant concentration, from the body surface. A second semiconducting region of the first conductivity type that has a second dopant concentration separates the first semiconducting region from the first device region and from the second device region. The first deep trench isolation structure includes a first isolation trench that extends into the semiconductor body from the body surface between the first device region and the second device region. The first electrically conductive body extends within the first isolation trench. A first dielectric material extends within the first isolation trench and electrically isolates the first electrically conductive body from the semiconductor body. The second deep trench isolation structure includes a second isolation trench that extends into the semiconductor body from the body surface between the first device region and the second device region. The second electrically conductive body extends within the second isolation trench. A second dielectric material extends within the second isolation trench and electrically isolates the second electrically conductive body from the semiconductor body. The first electrically conducive body can be spaced apart from the second electrically conductive body. The first electrically conductive body can be electrically isolated from the second electrically conductive body by the first dielectric material and by the second dielectric material. The first voltage can be different from the second voltage. The method can include applying the first voltage and applying the second voltage such that a magnitude of a difference between the first voltage and the second voltage is at least 40 volts. Additional examples of the magnitude of the difference between the first voltage and the second voltage are disclosed herein. Applying the first voltage can include applying zero volts to the first electrically conductive body. Applying the first voltage can include grounding the first electrically conductive body. Applying the second voltage can include electrically shorting the second electrically conductive body to the second device.

What is claimed is:

1. A method of forming a semiconductor device, the method comprising:
    forming a first semiconducting region of a first conductivity type within a semiconductor body of the first conductivity type, wherein
    (i) the first semiconducting region has a first dopant concentration,
    (ii) the semiconductor body has a body dopant concentration and a body surface, and
    (iii) a device region of the semiconductor device separates the first semiconducting region from the body surface;
    forming a second semiconducting region of the first conductivity type within the semiconductor body, wherein
    (i) the second semiconducting region has a second dopant concentration, and
    (ii) the second semiconducting region separates the device region from the first semiconducting region;
    forming an isolation trench that extends into the semiconductor body from the body surface and that further extends around the device region; and
    locating a dielectric material within the isolation trench;
    wherein the first dopant concentration is greater than the body dopant concentration, and further wherein the first dopant concentration is greater than the second dopant concentration.

2. The method of claim 1, wherein the method further comprises:
    forming a third semiconducting region of a second conductivity type that is opposite the first conductivity type within the semiconductor body, wherein the third semiconducting region has a third dopant concentration and separates the second semiconducting region from the device region;
    forming a fourth semiconducting region of the second conductivity type within the semiconductor body, wherein the fourth semiconducting region has a fourth dopant concentration and separates the third semiconducting region from the device region; and
    forming a fifth semiconducting region of the second conductivity type within the semiconductor body, wherein the fifth semiconducting region has a fifth dopant concentration and extends between the body surface and the fourth semiconducting region;
    wherein the fourth dopant concentration is greater than the third dopant concentration.

3. The method of claim 1, wherein the forming the isolation trench comprises forming the isolation trench such that the isolation trench extends through the first semiconducting region and through the second semiconducting region.

4. The method of claim 1, wherein the method further comprises:

locating an electrically conductive body within the isolation trench, wherein the dielectric material extends between the electrically conductive body and the semiconductor body and electrically isolates the electrically conductive body from the semiconductor body.

5. The method of claim 4, wherein the method further comprises:

forming an electrical connection to the electrically conductive body, wherein the electrical connection is configured to at least one of
(i) permit grounding of the electrically conductive body, and
(ii) permit an electrical potential to be conveyed to the electrically conductive body.

6. The method of claim 1, wherein:

the semiconductor device is a first semiconductor device of an integrated circuit device;

the device region is a first device region of the first semiconductor device;

the integrated circuit device further comprises a second device region of a second semiconductor device that is adjacent to the first device region;

the forming the first semiconducting region comprises forming the first semiconducting region such that both the first device region and the second device region separate the first semiconducting region from the body surface;

the forming the second semiconducting region comprises forming the second semiconducting region such that the second semiconducting region separates the first semiconducting region from both the first device region and the second device region; and the forming the isolation trench comprises forming such that the isolation trench extends between and in contact with the first device region and the second device region.

\* \* \* \* \*